(12) United States Patent
Chen et al.

(10) Patent No.: US 9,502,304 B2
(45) Date of Patent: Nov. 22, 2016

(54) SEMICONDUCTOR DEVICE AND DRIVER CIRCUIT WITH DRAIN AND ISOLATION STRUCTURE INTERCONNECTED THROUGH A DIODE CIRCUIT, AND METHOD OF MANUFACTURE THEREOF

(71) Applicant: FREESCALE SEMICONDUCTOR, INC., Austin, TX (US)

(72) Inventors: Weize Chen, Phoenix, AZ (US); Hubert M. Bode, Haar (DE); Richard J. De Souza, Chandler, AZ (US); Patrice M. Parris, Phoenix, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/846,115

(22) Filed: Sep. 4, 2015

(65) Prior Publication Data
US 2015/0380317 A1    Dec. 31, 2015

Related U.S. Application Data

(62) Division of application No. 13/538,529, filed on Jun. 29, 2012, now Pat. No. 9,129,990.

(51) Int. Cl.
*H01L 21/8234* (2006.01)
*H01L 29/66* (2006.01)
(Continued)

(52) U.S. Cl.
CPC ..... *H01L 21/823481* (2013.01); *H01L 21/761* (2013.01); *H01L 21/823418* (2013.01); *H01L 27/0629* (2013.01); *H01L 29/66136* (2013.01);
(Continued)

(58) Field of Classification Search
CPC .................. H01L 29/1083; H01L 29/7835
See application file for complete search history.

(56) References Cited

U.S. PATENT DOCUMENTS 5,156,989 A   10/1992 Williams et al.
5,257,175 A   10/1993 Skelton et al.
(Continued)

FOREIGN PATENT DOCUMENTS

EP    2680299 A2    1/2014
EP    2731144 A2    5/2014

OTHER PUBLICATIONS

Non-Final Rejection mailed Nov. 10, 2015 for U.S. Appl. No. 13/671,506 38 pgs.
Final Rejection mailed Dec. 7, 2015 for U.S. Appl. No. 13/538,577 36 pgs.
Extended European Search Report mailed Dec. 8, 2014 for EP Application No. EP 13173226.5 7pgs.
(Continued)

*Primary Examiner* — Caleb Henry
*Assistant Examiner* — Mounir Amer
(74) *Attorney, Agent, or Firm* — Sherry W. Schumm

(57) ABSTRACT

Embodiments of semiconductor devices and driver circuits include a semiconductor substrate having a first conductivity type, an isolation structure (including a sinker region and a buried layer), an active device within area of the substrate contained by the isolation structure, and a diode circuit. The buried layer is positioned below the top substrate surface, and has a second conductivity type. The sinker region extends between the top substrate surface and the buried layer, and has the second conductivity type. The active device includes a drain region of the second conductivity type, and the diode circuit is connected between the isolation structure and the drain region. The diode circuit may include one or more Schottky diodes and/or PN junction diodes. In further embodiments, the diode circuit may include one or more resistive networks in series and/or parallel with the Schottky and/or PN diode(s).

10 Claims, 11 Drawing Sheets

(51) Int. Cl.

| | | |
|---|---|---|
| *H01L 29/78* | (2006.01) | |
| *H01L 27/06* | (2006.01) | |
| *H01L 21/761* | (2006.01) | |
| *H01L 29/06* | (2006.01) | |
| *H01L 29/08* | (2006.01) | |
| *H01L 29/10* | (2006.01) | |
| *H03K 17/687* | (2006.01) | |
| *H03K 17/74* | (2006.01) | |

(52) U.S. Cl.
CPC ... *H01L 29/66143* (2013.01); *H01L 29/66659* (2013.01); *H01L 29/7835* (2013.01); *H01L 29/0653* (2013.01); *H01L 29/0692* (2013.01); *H01L 29/0847* (2013.01); *H01L 29/1083* (2013.01); *H03K 17/6871* (2013.01); *H03K 17/74* (2013.01); *H03K 2217/0018* (2013.01); *H03K 2217/0036* (2013.01)

(56) References Cited

U.S. PATENT DOCUMENTS

| | | | |
|---|---|---|---|
| 5,834,826 | A | 11/1998 | Menegoli |
| 5,889,310 | A | 3/1999 | Terashima et al. |
| 6,288,424 | B1 | 9/2001 | Ludikhuize |
| 6,573,562 | B2 | 6/2003 | Parthasarathy et al. |
| 6,727,547 | B1 | 4/2004 | Brisbin et al. |
| 6,784,489 | B1 | 8/2004 | Menegoli |
| 7,064,407 | B1 | 6/2006 | Mallikarjunaswamy |
| 7,141,860 | B2 | 11/2006 | Khemka et al. |
| 7,439,584 | B2 | 10/2008 | Khemka et al. |
| 2003/0080381 | A1 | 5/2003 | Parthasarathy et al. |
| 2003/0127687 | A1 | 7/2003 | Kumagai et al. |
| 2006/0011974 | A1 | 1/2006 | Pendharkar |
| 2006/0261408 | A1 | 11/2006 | Khemka et al. |
| 2009/0267110 | A1 | 10/2009 | Cai |
| 2009/0294849 | A1 | 12/2009 | Min et al. |
| 2011/0057262 | A1 | 3/2011 | Ma et al. |
| 2011/0101425 | A1 | 5/2011 | Grote et al. |
| 2011/0187475 | A1 | 8/2011 | Kim et al. |
| 2011/0241083 | A1 | 10/2011 | Khemka et al. |
| 2012/0175673 | A1 | 7/2012 | Lee |
| 2013/0278301 | A1 | 10/2013 | Huynh |
| 2014/0001473 | A1 | 1/2014 | Chen et al. |

OTHER PUBLICATIONS

Notice of Allowance mailed Jul. 16, 2015 for U.S. Appl. No. 13/671,503 9 pgs.
Non-Final Rejection mailed May 8, 2015 for U.S. Appl. No. 13/538,577 13 pgs.
Non-Final Rejection mailed May 19, 2015 for U.S. Appl. No. 13/671,506, 12 pgs.
Notice of Allowance mailed Jun. 22, 2015 for U.S. Appl. No. 13/538,565 8 pgs.
U.S. Appl. No. 13/538,577, Office Action- Final Rejection, mailed Jan. 23, 2015.
U.S. Appl. No. 13/671,506, Office Action—Final Rejection, mailed Feb. 25, 2015.
U.S. Appl. No. 13/671,503, Office Action—Restriction, mailed Feb. 12, 2015.
U.S. Appl. No. 13/538,565, Office Action—Restriction, mailed Feb. 18, 2015.
U.S. Appl. No. 13/538,577, Office Action- Restriction, mailed May 14, 2014.
U.S. Appl. No. 13/671,506, Office Action- Restriction, mailed May 16, 2014.
U.S. Appl. No. 13/538,565, Office Action- Restriction, mailed May 7, 2014.
U.S. Appl. No. 13/538,565, Office Action- Rejection, mailed Jul. 18, 2014.
U.S. Appl. No. 13/671,503, Office Action—Rejection, mailed Jul. 31, 2014.
U.S. Appl. No. 13/538,577, Bode, H.M., Office Action- Rejection, mailed Sep. 22, 2014.
EP 13172894.1, European Extended Search Report mailed Nov. 3, 2014.
EP 13191777.5, European Extended Search Report mailed Dec. 2, 2014.
U.S. Appl. No. 13/671,506, Bode, H. M., Office Action- Rejection, mailed Sep. 23, 2014.
Extended European Search Report mailed Jun. 26, 2015 for corresponding EP Application No. EP 13191789 9 pgs.
Notice of Allowance mailed Jun. 22, 2015 for U.S. Appl. No. 13/538,529, 8 pgs.
U.S. Appl. No. 13/538,529, Office Action—Restriction, mailed Feb. 12, 2015.
U.S. Appl. No. 13/538,529, Office Action- Rejection, mailed Jul. 18, 2014.

SEMICONDUCTOR DEVICE AND DRIVER CIRCUIT WITH DRAIN AND ISOLATION STRUCTURE INTERCONNECTED THROUGH A DIODE CIRCUIT, AND METHOD OF MANUFACTURE THEREOF

RELATED APPLICATION

This application is a divisional of co-pending, U.S. patent application Ser. No. 13/538,529, filed on Jun. 29, 2012, and now issued as U.S. Pat. No. 9,129,990.

TECHNICAL FIELD

Embodiments generally relate to semiconductor devices and their manufacturing methods, and more particularly relate to laterally diffused metal oxide semiconductor (LD-MOS) devices with isolation structures.

BACKGROUND

In some system-on-a-chip (SOC) applications that include an inductive load, certain nodes may experience a negative potential during switching, which may lead to significant injection current into the substrate. The charged carriers injected into the substrate may disturb adjacent circuits and adversely affect their operation.

Accordingly, there is an ongoing need for improved device structures, materials and methods of fabrication that can overcome this difficulty and provide improved performance. It is further desirable that the methods, materials, and structures employed be compatible with present day manufacturing capabilities and materials and not require substantial modifications to available manufacturing procedures or substantial increases in manufacturing costs. Furthermore, other desirable features and characteristics of the various embodiments will become apparent from the subsequent detailed description and the appended claims, taken in conjunction with the accompanying drawings and the foregoing technical field and background.

BRIEF DESCRIPTION OF THE DRAWINGS

Embodiments will hereinafter be described in conjunction with the following drawing figures, wherein like numerals denote like elements.

DETAILED DESCRIPTION

Figure 1:
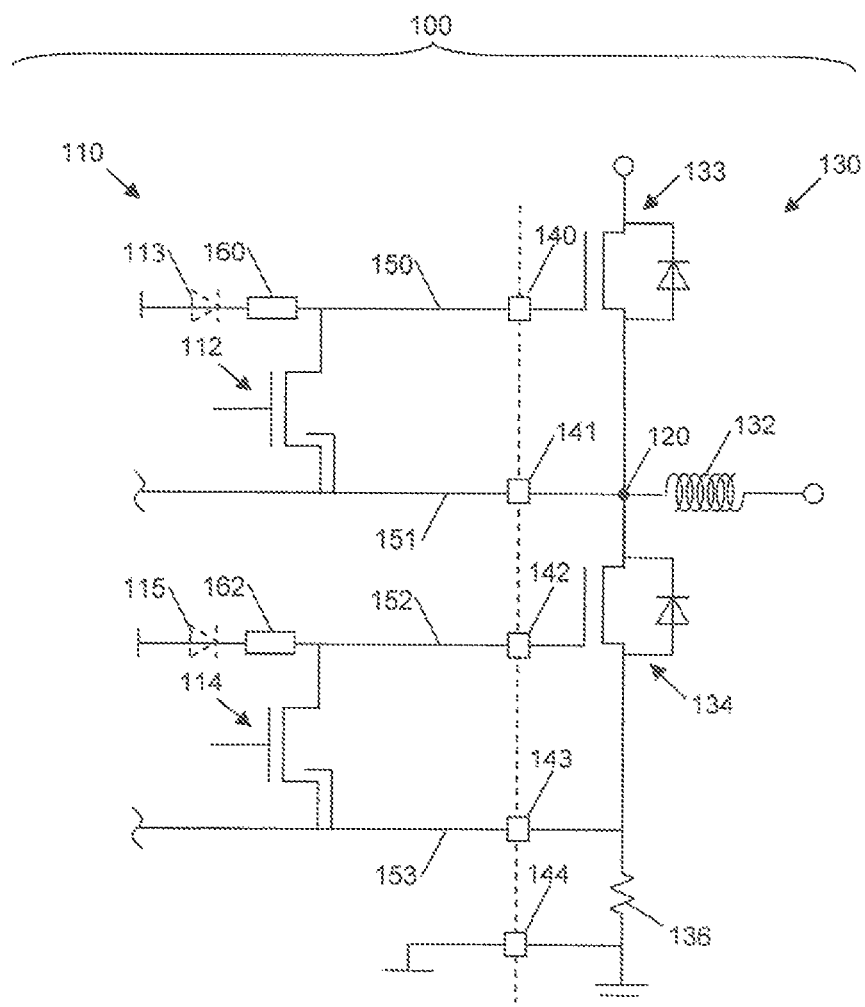
FIG. 1 is a simplified diagram of an electronic system that includes a driver circuit configured to drive an external circuit that includes an inductive load, according to an embodiment.

The following detailed description is merely exemplary in nature and is not intended to limit the embodiments or the application and uses of the various embodiments. Furthermore, there is no intention to be bound by any expressed or implied theory presented in the preceding technical field or background, or the following detailed description.

For simplicity and clarity of illustration, the drawing figures illustrate the general manner of construction, and descriptions and details of well-known features and techniques may be omitted to avoid unnecessarily obscuring the description of the embodiments. Additionally, elements in the drawings figures are not necessarily drawn to scale. For example, the dimensions of some of the elements or regions in some of the figures may be exaggerated relative to other elements or regions of the same or other figures to help improve understanding of the various embodiments.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments described herein are, for example, capable of use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "left," "right," "in," "out," "front," "back," "up," "down," "top," "bottom," "over," "under," "above," "below" and the like in the description and the claims, if any, are used for describing relative positions and not necessarily for describing permanent positions in space. It is to be understood that the embodiments described herein may be used, for example, in other orientations than those illustrated or otherwise described herein. The term "coupled," as used herein, is defined as directly or indirectly connected in an electrical or non-electrical manner.

The various embodiments of the invention described here are illustrated by semiconductor devices and structures of particular conductivity type having various P and N doped regions appropriate for that conductivity type device or structure. But this is merely for convenience of explanation and not intended to be limiting. Persons of skill in the art will understand that devices or structures of opposite conductivity type may be provided by interchanging conductivity types so that a P-type region becomes an N-type region and vice versa. Alternatively, the particular regions illustrated in what follows may be more generally referred to as of a "first conductivity type" and a "second opposite conductivity type", wherein the first conductivity type may be either N or P type and the second opposite conductivity type is then either P or N type, and so forth. Further, for convenience of explanation and not intended to be limiting, various embodiments of the present invention are described herein for silicon semiconductors, but persons of skill in the art will understand the invention is not limited to silicon but applies to a wide variety of semiconductor materials. Non-limiting examples are other type IV semiconductor materials, as well as type III-V and II-VI semiconductor materials, organic semiconductor materials and combinations thereof, whether in bulk form or in layered form or in thin film form or semiconductor-on-insulator (SOI) form or combinations thereof. Such materials may be single-crystal or poly-crystalline or amorphous or combinations thereof.

FIG. 1 is a simplified diagram of an electronic system 100 that includes a driver circuit 110 configured to drive an external circuit 130 that includes an inductive load 132, according to an embodiment. System 100 may be implemented in an automobile or other vehicle, where the inductive load 132 represents a portion of a motor, or other inductive component of the vehicle. Alternatively, system 100 or derivations thereof may be used in applications other than automotive or vehicular applications.

According to an embodiment, driver circuit 110 is part of a system-on-a-chip (SOC), where the driver circuit 110 and other portions of the SOC are formed on a single semiconductor substrate (referred to below as the "SOC substrate"). For example, the SOC also may include various processing components, memory arrays (e.g., flash arrays, static random access memory (SRAM) arrays, and so on), and other circuitry. For simplicity, other portions of the SOC are not illustrated in FIG. 1. As will be explained in more detail below, embodiments relate to systems and semiconductor components that are configured to reduce or eliminate undesirable current from being injected into the SOC substrate from the inductive load 132 or other sources.

Driver circuit 110 and other portions of the SOC are coupled with the external circuit 130 via at least "high side gate" (HG) pin 140, "high side source" (HS) pin 141, "low side gate" (LG) pin 142, a "low side source" (LS) pin 143, and ground pin 144. Although referred to as "pins" herein, pins 140-144 may include any combination of pins, leads, bumps, balls, or other types of contacts. In FIG. 1, the vertical, dashed line through pins 140-144 represents the division between the SOC (including driver circuit 110) and the external circuit 130.

As mentioned above, external circuit 130 includes an inductive load 132, a first "high side" FET 133, a second "low side" FET 134, and a shunt resistor 136, in an embodiment. As will be explained in more detail later, under certain circumstances, inductive load 132 may function as a source of injected current, which couples to the driver circuit 110. The high side FET 133 and the low side FET 134 each include a body diode, as shown in FIG. 1. HS pin 141 is coupled to an input terminal of the inductive load 132, the source of high side FET 133, and the drain of low side FET 134 at node 120. The source of low side FET 134 is coupled to LS pin 143 and to ground through shunt resistor 136. The gate of high side FET 133 is coupled to HG pin 140, and high side FET 133 is turned on and off in response to signals received from driver circuit 110 through HG pin 140. The gate of low side FET 134 is coupled to LG pin 142, and low side FET 134 is turned on and off in response to signals received from driver circuit 110 through LG pin 142.

According to an embodiment, driver circuit 110 includes, along a first current path, at least a first N-type LDMOS field effect transistor (NLDMOSFET) 112. Node 150 couples the drain of NLDMOSFET 112 to HG pin 140. Node 151 couples the source and body of NLDMOSFET 112 to HS pin 141. Along a second current path, driver circuit 110 also may include a second NLDMOSFET 114. Node 152 couples the drain of NLDMOSFET 114 to LG pin 142. Node 153 couples the source and body of NLDMOSFET 114 to LS pin 143. The SOC substrate is connected to system ground through ground pin 144.

As will be explained in more detail later in conjunction with the other figures, the active areas of NLDMOSFETs 112 and 114 each may be formed within an isolation structure or isolation "tub" (e.g., an N-type buried layer and N-type sinker region that surrounds the active area). The isolation structures are configured to isolate the active areas of NLDMOSFETs 112 and 114 from the remainder of the SOC substrate. The isolation structures may allow NLDMOSFETs 112 and 114 to operate with a body bias. In addition, the isolation structures may help to prevent current injection into the SOC substrate under normal operating conditions. For example, as represented in FIG. 1, diodes 113 and 115 are buried layer-to-substrate diodes associated with NLDMOSFETs 112 and 114, where the diodes 113 and 115 allow pins 141-143 to be at positive potentials without shorting to the SOC substrate.

In some systems, the drains of NLDMOSFETs 112 and 114 and their associated isolation structures are electrically shorted through metallization so that the drain electrodes and the isolation structures always are at a same potential. This arrangement is beneficial because, in the NLDMOS- FETs 112 and 114, the substrate material between the drift region and each isolation structure's buried layer may not be able to sustain a full reverse bias at maximum Vdd from both the drift region and the buried layer.

While shorting together the drain regions of the NLD-MOSFETs 112 and 114 to the isolation structures of NLD-MOSFETs 112 and 114 may work well under many operating conditions, this arrangement may allow undesirable current to be injected into the substrate of the SOC under certain other operating conditions. For example, at the moment that the driver circuit 110 turns the high side FET 133 off (e.g., by turning on NLDMOSFET 112), the low side FET 134 also is off (e.g., NLDMOSFET 114 is conducting). In this state, the current in the inductive load 132 may push the HS pin 141 negative until the body diode of the low side FET 134 is forward biased. The driver circuit 110 may be controlled to turn on the low side FET 134 in order to lower the power dissipation of the low side FET 134 some time later. Then, the negative potential at node 120 and the HS pin 141 (and thus the source and body of NLDMOSFET 112) is defined by the inductive load current times the sum of the resistance of shunt resistor 136 and the RDSON of the low side FET 134. On the LS pin 143 (and the source and body of NLDMOSFET 114), a lesser negative potential is defined by the inductive load current times the resistance of the shunt resistor 136. For a while after the high side FET 133 is turned off, the NLDMOSFETs 112 and 114 have positive gate-source voltages (Vgs), thus causing the drains to short with the sources of NLDMOSFETs 112 and 114. In systems in which the drain electrodes and isolation structures of NLDMOSFETs 112 and 114 are merely shorted, the negative potentials on the HS pin 141 and the LS pin 143 may then access nodes 150, 152 and at least two injecting sites (N-type areas) in the SOC substrate through the conducting channels of NLDMOSFETs 112 and 114. Because the negative potential on the HS pin 141 is greater than the negative potential on the LS pin 143, the potential for current injection as a result of the negative potential on the HS pin 141 is a larger issue than the potential for current injection as a result of the negative potential on the LS pin 143. To avoid the high power dissipation in the body diode of low side FET 134 for an extended period of time, low side FET 134 is turned on (i.e., by turning off NLDMOSFET 114) shortly after the high side FET 133 is turned off. However, the potential at node 120 (and thus HS pin 141) will still be negative, and the issue of current injection may still exist, although to a lesser extent.

According to various embodiments, driver circuit 110 includes further circuitry configured to reduce or eliminate current injection into the SOC substrate under the above-described or other operating conditions. More particularly, in an embodiment, driver circuit 110 includes a first diode circuit 160 coupled between a drain region and the isolation structure of NLDMOSFET 112, and a second diode circuit 162 coupled between the drain region and the isolation structure of NLDMOSFET 114. By inserting the diode circuits 160 and 162 at these locations, the injection current can be reduced or eliminated. More specifically, the injection sites are moved behind diode circuits 160 and 162, thus significantly limiting the current that may be injected into the SOC substrate at a given potential on the HS pin 141 and/or the LS pin 143. For example, during high side turn off in the context of normal operations, the voltage on the HS pin 141 may swing negative between about −0.3 volts and −6.0 volts (or some other normal operating value). According to various embodiments, diode circuits 160 and 162 may include diodes with breakdown voltages that are greater than, less than, or equal to the lowest normal negative operating voltage. Although not illustrated in FIG. 1, driver circuit 110 may include additional NLDMOSFET devices, which also include diode circuits coupled between their drain regions and isolation structures for the purpose of reducing or eliminating current injection into the SOC substrate. In addition, although not illustrated in FIG. 1, driver circuit 110 may include one or more P-type LDMOS-FET devices, which include diode circuits coupled between their source regions and isolation structures for the purpose of reducing or eliminating current injection into the SOC substrate.

As used herein, a "diode circuit" is a circuit that includes one or more diodes. As will be described in more detail later in conjunction with the remaining figures, a "diode" may be formed from a Schottky contact and a doped semiconductor region, a PN junction, a polycrystalline silicon diode, and combinations of these or other diode components. Also, when referring to "a diode" herein, it is to be understood that the term may include a single diode or an arrangement of diodes in series or parallel. Similarly, when referring to "a resistive network" herein, it is to be understood that the term may include a single resistor or an arrangement of resistors in series or parallel. As will be explained in more detail later, embodiments of "diode circuits" discussed herein include at least one diode, and also may include one or more other components (e.g., one or more resistive networks or other components in series and/or parallel with the diode(s) of the diode circuit).

Figure 2:
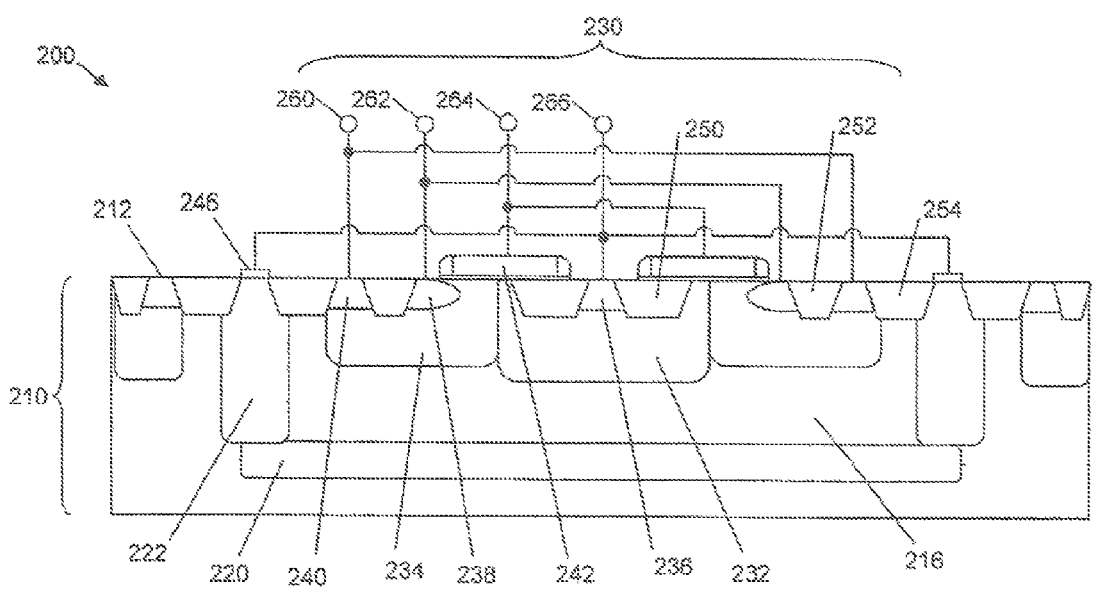
FIG. 2 is a cross-sectional view of an N-type, laterally-diffused metal oxide semiconductor field effect transistor (NLDMOSFET) with a diode circuit that includes a Schottky diode, according to an embodiment.

Embodiments of NLDMOSFETs (e.g., NLDMOSFET 112) and associated diode circuits (e.g., diode circuit 160) are described in more detail below. For example, according to an embodiment, a diode circuit 160 coupling the drain region and isolation structure of NLDMOSFET 112 includes a Schottky diode. Such an embodiment is illustrated in FIG. 2, which is a cross-sectional view of an NLDMOSFET 200 (e.g., NLDMOSFET 112, FIG. 1) with a diode circuit (e.g., diode circuit 160, FIG. 1) that includes a Schottky diode, as will be explained in more detail below. According to an embodiment, various regions of NLDMOSFET 200 (and NLDMOSFETs 600, 700, 1100, 1300, FIGS. 6, 7, 11, and 13, discussed later) have ring-shaped configurations oriented in planes that are perpendicular to the cross-section illustrated in FIG. 2. Although the figures and description herein particularly apply to a double gate finger configuration, the scope of the inventive subject matter is not limited to such configurations. Those of skill in the art would understand, based on the description herein, how to modify the illustrated and described embodiments to apply to configurations that include multiple (i.e., >2) gate fingers, where adjacent gate fingers may share a drain (e.g., drain region 236) on one side and a body contact region (e.g., body contact region 240) on the other side. In such embodiments, a body contact region may be more laterally separated from the sinker region (e.g., sinker region 222) than is depicted in the figures.

NLDMOSFET 200 is formed in and on a semiconductor substrate 210 (e.g., the SOC substrate discussed in conjunction with FIG. 1), which has a top substrate surface 212. According to an embodiment, NLDMOSFET 200 includes an isolation structure that substantially surrounds a portion 216 of the substrate associated with an active area 230 of the NLDMOSFET 200 (i.e., an area of the substrate 210 within which an active device is formed). In other words, the active device may be considered to be contained by the isolation structure. The isolation structure is a box-type structure, which is formed from an N-type buried layer (NBL) 220

(located at a depth below the top substrate surface 212) and an N-type sinker region 222 extending from the top substrate surface 212 to the depth of the NBL 220. The sinker region 222 may be formed using a single implantation procedure having an implant energy sufficient to enable the sinker region 222 to extend to the NBL 220, or the sinker region 222 may be formed using multiple implantation procedures having different implant energies, thus forming a series of interconnected sinker sub-regions at different depths.

NLDMOSFET 200 further includes an active device formed within the active area 230. According to an embodiment, the active device includes an N-type drift region 232, a P-type body region 234, an N-type drain region 236, an N-type source region 238, a P-type body contact region 240 (also referred to as a "body tie"), and a gate electrode 242 (and corresponding gate dielectric, not numbered). The drift region 232 is formed within a central portion of the active area 230, and extends from the top substrate surface 212 into the substrate 210 to a depth that is less than the depth of NBL 220. The drain region 236 is formed within the drift region 232, and is more heavily doped than the drift region 232. The drain region 236 extends from the top substrate surface 212 into the substrate 210 to a depth significantly less than the depth of the drift region 232. The body region 234 is formed between the drift region 232 and the sinker region 222, and extends from the top substrate surface 212 into the substrate 210 to a depth that is less than the depth of NBL 220, and that may be less than the depth of the drift region 232 (although body region 234 may extend to depths that are substantially equal to or greater than the depth of the drift region 232, as well). In an embodiment, the body region 234 abuts the drift region 232 and is laterally separated from the sinker region 222, as shown in FIG. 2. In alternate embodiments, the body region 234 may be laterally separated from the drift region 232, or the body region 234 may overlap the drift region 232 (creating a region with a dopant profile that differs from that in the channel or drift region 232). The source region 238 and body contact region 240 are formed within the body region 234, each extending from the top substrate surface 212 into the substrate 210 to a depth significantly less than the depth of the body region 234. The source region 238 is of an opposite conductivity type from the body region 234, and may be more heavily doped than the drift region 232, and the body contact region 240 is more heavily doped than the body region 234. A conductive interconnect electrically couples the body contact region 240 to a body contact terminal 260, and an additional conductive interconnect electrically couples the source region 238 to a source terminal 262. Gate electrode 242 is formed over a gate oxide on the top substrate surface 212 generally between the drain region 236 and the source region 238. A conductive interconnect also electrically couples the gate electrode 242 to a gate terminal 264.

According to an embodiment, NLDMOSFET 200 may further include various shallow trench isolation (STI) structures 250, 252, 254, as shown in FIG. 2. For example, at the top substrate surface 212, STI 250 abuts the drain region 236 within drift region 232, STI 252 is positioned between the source region 238 and the body contact region 240, and STI 254 is positioned between the body contact region 240 and the isolation structure (or more specifically, sinker region 222). In alternate embodiments, some or all of STI structures 250, 252, and/or 254 may be excluded. For example, STI 252 may be excluded, and source region 238 and body contact region 240 may be shorted together. In addition, STI 250 may be excluded, making NLDMOSFET 200 an "active drift device," rather than the "field drift device" illustrated in FIG. 2. The inclusion of STI 250 allows for a high potential in the drift region while reducing the risk of rupturing the gate oxide. In still other alternate embodiments, some or all of the STI structures may be replaced with a silicide blocking layer that prevents silicide formation at the surface that would otherwise short the various regions together.

According to an embodiment, NLDMOSFET 200 further includes a diode circuit (e.g., diode circuit 160, FIG. 1) connected between drain region 236 and the isolation structure. More particularly, in an embodiment, the diode circuit includes a Schottky diode formed from the metal-semiconductor junction between a Schottky contact 246 (e.g., formed with silicide on the top substrate surface 212) and the top surface of sinker region 222. In an alternate embodiment, the Schottky contact 246 may be formed on a sidewall or other surface that is not co-planar with the top substrate surface 212. According to an embodiment, a conductive interconnect electrically couples the drain region 236, the Schottky contact 246, and a drain terminal 266. The Schottky diode can be designed to provide a desired breakdown voltage (e.g., a breakdown voltage greater than, less than, or equal to the normal, most negative operating voltage, depending on the application). For example, in an embodiment, the Schottky diode is designed to provide a reverse breakdown voltage in a range of about −0.3 volts to about −14.0 volts, although smaller or larger breakdown voltages may be achieved, as well.

Figure 3:
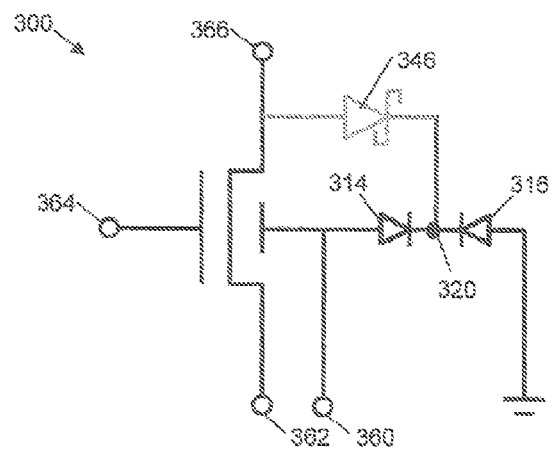
FIG. 3 is a simplified circuit representation of the NLD-MOSFET of FIG. 2, according to an embodiment.

FIG. 3 is a simplified circuit representation 300 of the NLDMOSFET 200 of FIG. 2, according to an embodiment. Referring also to FIG. 2, terminal 360 (e.g., terminal 260) is coupled with the P-type body region (e.g., coupled to body region 234 via body contact region 240), terminal 362 (e.g., terminal 262) is coupled with the N-type source region (e.g., source region 238), terminal 364 (e.g., terminal 264) is coupled with the gate electrode (e.g., gate electrode 242), and terminal 366 (e.g., terminal 266) is coupled with the drain region (e.g., drain region 236).

According to an embodiment, and as discussed above, the NLDMOSFET also includes Schottky diode 346 (e.g., the interface between Schottky contact 246 and sinker region 222) electrically coupled between the drain region (e.g., drain region 236) and the device's isolation structure. More specifically, the anode of the Schottky diode 346 is coupled to the drain region, and the cathode of the Schottky diode 346 is formed by the isolation structure (e.g., the combination of sinker region 222 and NBL 220). At node 320, diode 314 represents the diode formed by the interface between the isolation structure and the portion of the substrate within the active area of the device (e.g., the portion 216 of the substrate 210 within the isolation structure), and diode 316 represents the diode formed by the interface between the isolation structure and the remainder of the substrate outside of the isolation structure.

During normal operation in which the drain potential is elevated, the Schottky diode 346 is forward biased. Accordingly, the isolation structure potential closely follows that of the drain region with only a small forward voltage drop at the Schottky barrier. On the other hand, when the drain potential transitions to a negative voltage, the isolation structure potential is held up by the reverse breakdown voltage of the Schottky diode 346 (e.g., between about −0.3 volts to about −14.0 volts). By holding up the potential of the isolation structure when the drain potential goes negative, carrier injection into the substrate that may otherwise occur if the drain and isolation structure were merely shorted may be reduced or eliminated, thus avoiding disruption of adjacent circuit blocks.

Figure 4:
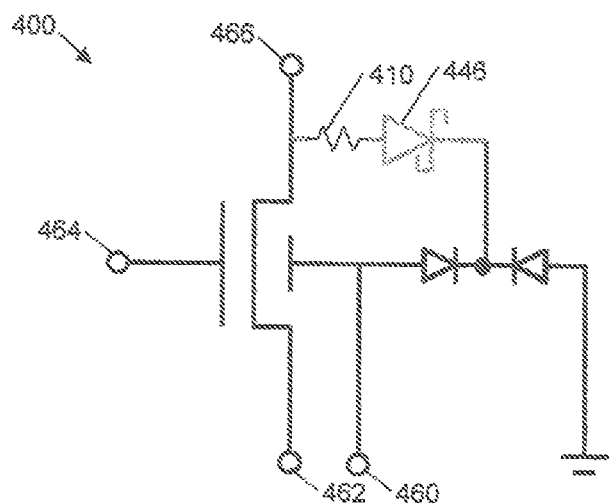
FIG. 4 is a simplified circuit representation of the NLD-MOSFET of FIG. 2 with a diode circuit that includes a resistive network in series with a Schottky diode, according to an alternate embodiment.

According to another embodiment, the diode circuit (e.g., diode circuit 160, FIG. 1) may include a resistive network in series with a Schottky diode. For example, FIG. 4 is a simplified circuit representation 400 of the NLDMOSFET 200 of FIG. 2 with a diode circuit that includes a resistive network 410 in series with a Schottky diode 446, according to an alternate embodiment. Similar to the embodiment of FIG. 3, terminal 460 (e.g., terminal 260) is coupled with the P-type body region (e.g., coupled to body region 234 via body contact region 240), terminal 462 (e.g., terminal 262) is coupled with the N-type source region (e.g., source region 238), terminal 464 (e.g., terminal 264) is coupled with the gate electrode (e.g., gate electrode 242), and terminal 466 (e.g., terminal 266) is coupled with the drain region (e.g., drain region 236).

Schottky diode 446 (e.g., the interface between Schottky contact 246 and sinker region 222) and resistive network 410 are electrically coupled in series between the drain region (e.g., drain region 236) and the device's isolation structure. For example, resistive network 410 may be formed from polycrystalline silicon, and may be located on an insulated region of the top surface of the substrate (e.g., on STI 254). Alternatively, resistive network 410 may be formed from other materials and/or located elsewhere. During operation, when the drain potential transitions to a negative voltage, the isolation structure potential is held up by the voltage drop across resistive network 410 in series with the reverse breakdown voltage of the Schottky diode 446 (e.g., between about −0.3 volts to about −14.0 volts). The combination of the Schottky diode 446 and resistive network 410 may allow for more flexibility in the construction of the Schottky diode 446. In addition, in choosing a value for resistive network 410 to achieve optimum overall results in maintaining the NLDMOSFET's integrity, electrostatic discharge (ESD) robustness may be achieved while reducing substrate injection. More specifically, for example, under conditions in which the Schottky diode 446 is run into breakdown (e.g., during ESD stress), the current through the Schottky diode 446 is limited by resistive network 410 to the extent of its capability, thus reducing the likelihood that an ESD event may damage Schottky diode 446.

Figure 5:
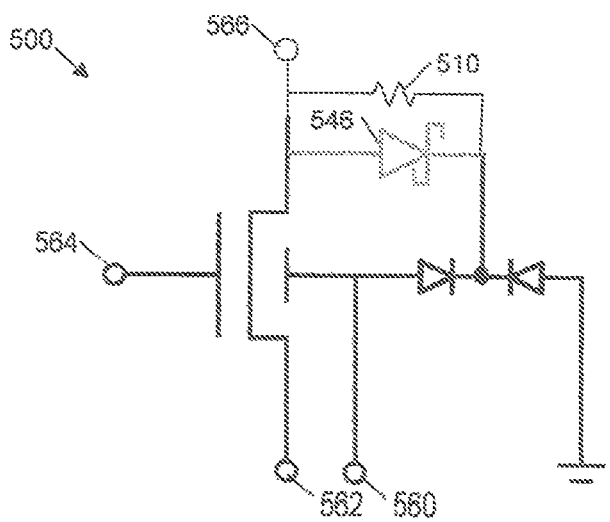
FIG. 5 is a simplified circuit representation of the NLD-MOSFET of FIG. 2 with a diode circuit that includes a resistive network in parallel with a Schottky diode, according to another alternate embodiment.

According to yet another embodiment, the diode circuit (e.g., diode circuit 160, FIG. 1) may include a resistive network in parallel with a Schottky diode. For example, FIG. 5 is a simplified circuit representation 500 of the NLDMOSFET 200 of FIG. 2 with a diode circuit that includes a resistive network 510 in parallel with a Schottky diode 546, according to an alternate embodiment. Similar to the embodiment of FIG. 2, terminal 560 (e.g., terminal 260) is coupled with the P-type body region (e.g., coupled to body region 234 via body contact region 240), terminal 562 (e.g., terminal 262) is coupled with the N-type source region (e.g., source region 238), terminal 564 (e.g., terminal 264) is coupled with the gate electrode (e.g., gate electrode 242), and terminal 566 (e.g., terminal 266) is coupled with the drain region (e.g., drain region 236).

Schottky diode 546 (e.g., the interface between Schottky contact 246 and sinker region 222) and resistive network 510 are electrically coupled in parallel between the drain region (e.g., drain region 236) and the device's isolation structure. For example, resistive network 510 may be formed from polycrystalline silicon, and may be located on an insulated region of the top surface of the substrate (e.g., on STI 254). Alternatively, resistive network 510 may be formed from other materials and/or located elsewhere. During operation, when the drain potential transitions to a negative voltage, the isolation structure potential is held up by the voltage drop across resistive network 510 in parallel with the reverse breakdown voltage of the Schottky diode 546 (e.g., between about −0.3 volts to about −14.0 volts). As with the diode circuit discussed in conjunction with FIG. 4, the combination of the Schottky diode 546 and resistive network 510 may allow for more flexibility in the construction of the Schottky diode 546. In addition, resistive network 510 may function to maintain the potential of the isolation structure closer to the drain potential of the NLDMOSFET, under certain circumstances. For example, when the drain potential is falling (although still positive), the potential of the isolation structure is pulled down only by the capacitance of Schottky diode 546, which may or may not be sufficient. In such a case, resistive network 510 may help to discharge the potential of the isolation structure towards the drain potential. Although some minority carrier injection may be added when the drain potential transitions negative, resistive network 510 may limit the amount of carrier injection.

In the embodiments discussed in conjunction with FIGS. 4 and 5, a diode circuit (e.g., diode circuit 160, FIG. 1) includes a Schottky diode (e.g., Schottky diodes 446, 546) and either a resistive network coupled in series (resistive network 410) or a resistive network coupled in parallel (resistive network 510) with the Schottky diode. In another alternate embodiment, a diode circuit may include a Schottky diode and both a first resistive network coupled in series and a second resistive network coupled in parallel with the Schottky diode, in order to realize the advantages that may be provided by both the series-coupled and parallel-coupled resistive network arrangements.

Figure 6:
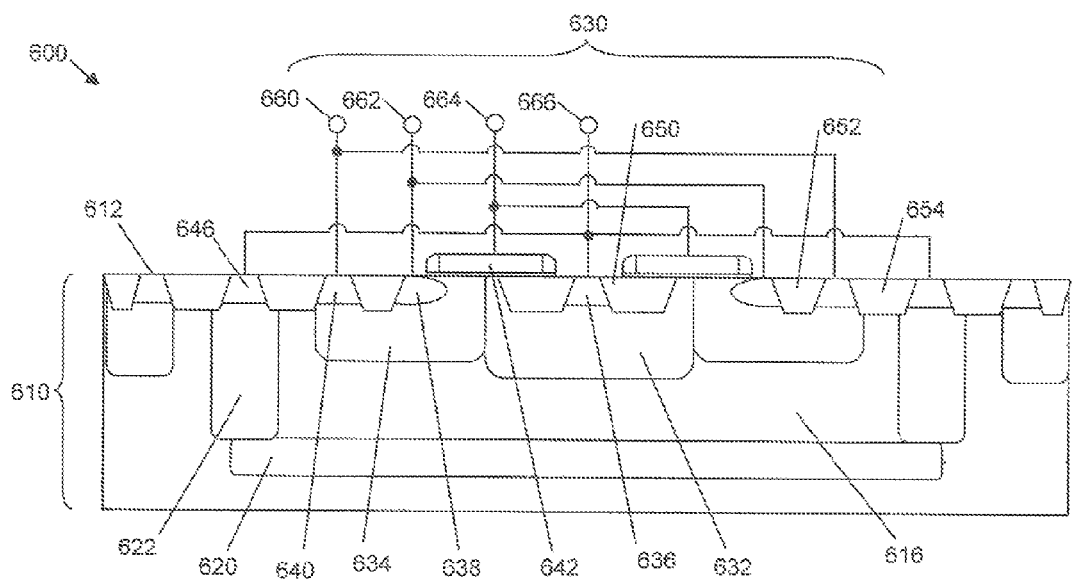
FIG. 6 is a cross-sectional view of an NLDMOSFET with a diode circuit that includes a PN junction diode, according to an alternate embodiment.
Figure 7:
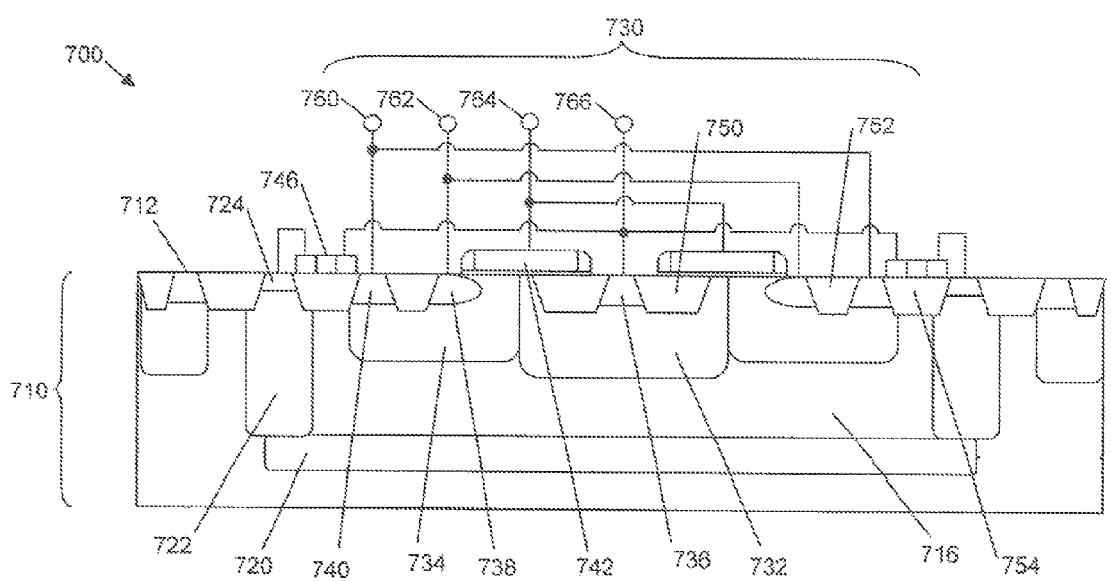
FIG. 7 is a cross-sectional view of an NLDMOSFET with a diode circuit that includes a polycrystalline silicon diode, according to another alternate embodiment.

In the embodiments discussed in conjunction with FIGS. 2-5, a diode circuit (e.g., diode circuit 160, FIG. 1) coupling the drain region and isolation structure of an embodiment of an NLDMOSFET (e.g., NLDMOSFET 112, FIG. 1) includes a Schottky diode. According to other embodiments, a diode circuit coupling the drain region and isolation structure of an embodiment of an NLDMOSFET instead includes a PN junction diode (e.g., including either a PN junction (FIG. 6) or a polysilicon diode (FIG. 7)). For example, FIGS. 6 and 7 are cross-sectional views of NLDMOSFETs 600, 700 (e.g., NLDMOSFET 112, FIG. 1), each with a diode circuit (e.g., diode circuit 160, FIG. 1) that includes a PN junction diode. Much of the structure of the NLDMOSFETs 600, 700 (FIGS. 6, 7) is similar to the structure of NLDMOSFET 200 discussed in detail in conjunction with FIG. 2. For brevity, the similar structural elements are not discussed in detail below, but the discussion in conjunction with FIG. 2 is intended to apply equally to FIGS. 6 and 7. In addition, common elements of FIGS. 6 and 7 are discussed together, below, and the differences between the devices are specified thereafter.

NLDMOSFETs 600, 700 are formed in and on a P-type semiconductor substrate 610, 710 (e.g., the SOC substrate discussed in conjunction with FIG. 1), which has a top substrate surface 612, 712. Each NLDMOSFET 600, 700 includes an isolation structure that substantially surrounds a portion 616, 716 of the substrate 610, 710 corresponding to an active area 630, 730 of the NLDMOSFET 600, 700. The isolation structure is formed from NBL 620, 720 (located at a depth below the top substrate surface 612, 712) and an N-type sinker region 622, 722 extending from the top substrate surface 612, 712 to the depth of the NBL 620, 720. NLDMOSFET 600, 700 further includes an active device formed within the active area 630, 730. According to an embodiment, the active device includes an N-type drift region 632, 732, a P-type body region 634, 734, an N-type drain region 636, 736, an N-type source region 638, 738, a P-type body contact region 640, 740, and a gate electrode 642, 742. A conductive interconnect electrically couples the body contact region 640, 740 to a body contact terminal 660, 760, and an additional conductive interconnect electrically couples the source region 638, 738 to a source terminal 662, 762. Similarly, a conductive interconnect also electrically couples the gate electrode 642, 742 to a gate terminal 664, 764. NLDMOSFET 600, 700 may further include STI structures 650, 750, 652, 752, 654, 754. In alternate embodiments, some or all of STI structures 650, 750, 652, 752, 654, and/or 754 may be excluded. In still other alternate embodiments, some or all of the STI structures may be replaced with a silicide blocking layer.

According to an embodiment, NLDMOSFET 600 (FIG. 6) further includes a diode circuit (e.g., diode circuit 160, FIG. 1) that includes a PN junction diode connected between drain region 636 and the isolation structure. More particularly, NLDMOSFET 600 further includes a P-type region 646 extending into sinker region 622, where P-type region 646 may be more heavily doped than P-type body region 634. The PN junction between P-type region 646 and sinker region 622 forms the PN junction diode of the diode circuit. According to an embodiment, a conductive interconnect electrically couples the drain region 636, the P-type region 646, and a drain terminal 666. The PN junction diode can be designed to provide a desired application-dependent breakdown voltage (e.g., a breakdown voltage greater than, less than, or equal to the normal, most negative operating voltage). For example, in an embodiment, the PN junction diode may be designed to provide a reverse breakdown voltage in a range of about −0.3 volts to about −14.0 volts, although smaller or larger breakdown voltages may be achieved, as well.

According to another embodiment, NLDMOSFET 700 (FIG. 7) further includes a diode circuit (e.g., diode circuit 160, FIG. 1) that includes a polysilicon diode 746, which is connected between drain region 736 and an N-type region 724 extending into the sinker region 722, where N-type region 724 is more heavily doped than sinker region 722 to provide for Ohmic contact to sinker region 722. For example, polysilicon diode 746 may be formed from a P-type region and an N-type region separated by a neutral spacer region that defines the breakdown voltage of polysilicon diode 746. Polysilicon diode 746 may be formed on an insulated region of the top surface of the substrate (e.g., on STI 754, as shown). Alternatively, polysilicon diode 746 may be formed from other materials and/or located elsewhere. In an embodiment, the polysilicon diode 746 may be designed to provide a desired application-dependent reverse breakdown voltage greater than, less than, or equal to the normal, most negative operating voltage (e.g., a breakdown voltage in a range of about −0.3 volts to about −14.0 volts, although smaller or larger breakdown voltages may be achieved, as well). According to an embodiment, a conductive interconnect electrically couples the drain region 736, the anode of polysilicon diode 746, and a drain terminal 766. Another conductive interconnect electrically couples the cathode of polysilicon diode 746 to sinker region 722 at the top substrate surface 712.

Figure 8:
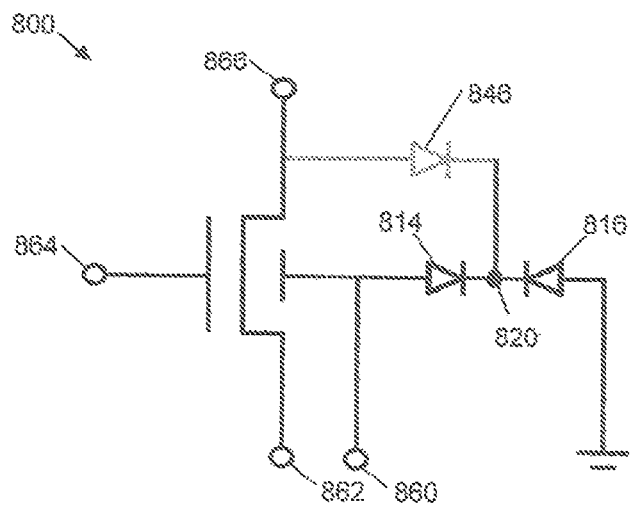
FIG. 8 is a simplified circuit representation of the NLD-MOSFETs of FIGS. 6 and 7, according to an embodiment.

FIG. 8 is a simplified circuit representation 800 of the NLDMOSFET 600, 700 of FIGS. 6 and 7, according to an embodiment. Referring also to FIGS. 6 and 7, terminal 860 (e.g., terminal 660, 760) is coupled with the P-type body region (e.g., coupled to body region 634, 734 via body contact region 640, 740), terminal 862 (e.g., terminal 662, 762) is coupled with the N-type source region (e.g., source region 638, 738), terminal 864 (e.g., terminal 664, 764) is coupled with the gate electrode (e.g., gate electrode 642, 742), and terminal 866 (e.g., terminal 666, 766) is coupled with the drain region (e.g., drain region 636, 736).

According to an embodiment, and as discussed above, the NLDMOSFET also includes PN junction diode 846 (e.g., the PN junction diode formed between P+ region 646 and sinker region 622, or polysilicon diode 746) electrically coupled between the drain region (e.g., drain region 636, 736) and the device's isolation structure. More specifically, the anode of the PN junction diode 846 is coupled to the drain region, and the cathode of the PN junction diode 846 is formed by the isolation structure (e.g., the combination of sinker region 622, 722 and NBL 620, 720). At node 820, diode 814 represents the diode formed by the interface between the isolation structure and the portion of the substrate within the isolation structure or active area of the device (e.g., the portion 616, 716 of the substrate 610, 710 within the isolation structure), and diode 816 represents the diode formed by the interface between the isolation structure and the remainder of the substrate outside of the isolation structure.

During normal operation in which the drain potential is elevated, the PN junction diode 846 is forward biased. Accordingly, the isolation structure potential closely follows that of the drain region with a relatively small forward voltage drop at the PN junction. On the other hand, when the drain potential transitions to a negative voltage, the isolation structure potential is held up by the reverse breakdown voltage of the PN junction diode 846 (e.g., between about −0.3 volts to about −14.0 volts or more). As with the embodiment previously discussed in conjunction with FIG. 2, by holding up the potential of the isolation structure when the drain potential goes negative, carrier injection into the substrate that may otherwise occur if the drain and isolation structure were merely shorted may be reduced or eliminated, thus avoiding disruption of adjacent circuit blocks.

Figure 9:
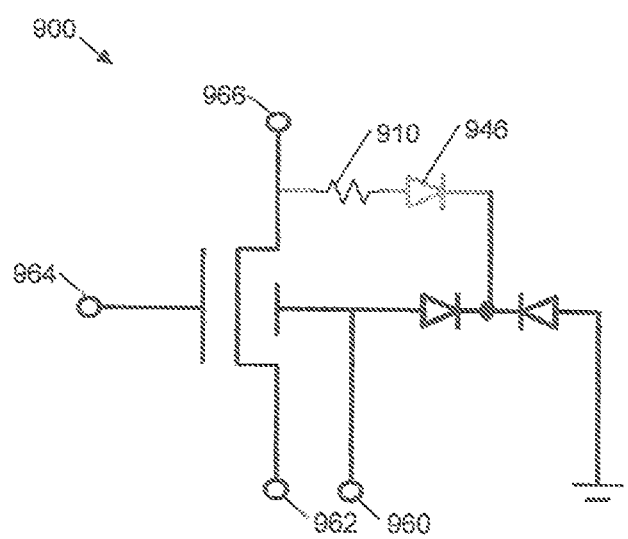
FIG. 9 is a simplified circuit representation of the NLD-MOSFETs of FIGS. 6, 7 with a diode circuit that includes a resistive network in series with a PN junction diode, according to an alternate embodiment.

According to another embodiment, the diode circuit (e.g., diode circuit 160, FIG. 1) may include a resistive network in series with a PN junction diode. For example, FIG. 9 is a simplified circuit representation 900 of the NLDMOSFETs 600, 700 of FIGS. 6, 7 with a diode circuit that includes a resistive network 910 in series with a PN junction diode 946, according to an alternate embodiment. Similar to the embodiment of FIG. 8, terminal 960 (e.g., terminal 660, 760) is coupled with the P-type body region (e.g., coupled to body region 634, 734 via body contact region 640, 740), terminal 962 (e.g., terminal 662, 762) is coupled with the N-type source region (e.g., source region 638, 738), terminal 964 (e.g., terminal 664, 764) is coupled with the gate electrode (e.g., gate electrode 642, 742), and terminal 966 (e.g., terminal 666, 766) is coupled with the drain region (e.g., drain region 636, 736).

PN junction diode 946 (e.g., the PN junction diode formed between P+ region 646 and sinker region 622, or polysilicon diode 746) and resistive network 910 are electrically coupled in series between the drain region (e.g., drain region 636, 736) and the device's isolation structure. For example, resistive network 910 may be formed from polycrystalline silicon, and may be located on an insulated region of the top surface of the substrate (e.g., on STI 654, 754). Alternatively, resistive network 910 may be formed from other materials and/or located elsewhere. During operation, when the drain potential transitions to a negative voltage, the isolation structure potential is held up by the voltage drop across resistive network 910 in series with the reverse breakdown voltage of the PN junction diode 946 (e.g., between about −0.3 volts to about −14.0 volts or more). As with the embodiment previously discussed in conjunction with FIG. 4, the combination of the PN junction diode 946 and resistive network 910 may provide certain advantageous effects.

Figure 10:
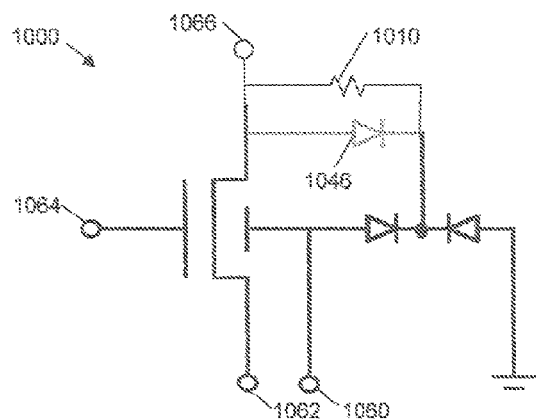
FIG. 10 is a simplified circuit representation of the NLDMOSFETs of FIGS. 6, 7 with a diode circuit that includes a resistive network in parallel with a PN junction diode, according to another alternate embodiment.

According to yet another embodiment, the diode circuit (e.g., diode circuit 160, FIG. 1) may include a resistive network in parallel with a PN junction diode. For example, FIG. 10 is a simplified circuit representation 1000 of the NLDMOSFETs 600, 700 of FIGS. 6, 7 with a diode circuit that includes a resistive network 1010 in parallel with a PN junction diode 1046, according to an alternate embodiment. Similar to the embodiment of FIG. 8, terminal 1060 (e.g., terminal 660, 760) is coupled with the P-type body region (e.g., coupled to body region 634, 734 via body contact region 640, 740), terminal 1062 (e.g., terminal 662, 762) is coupled with the N-type source region (e.g., source region 638, 738), terminal 1064 (e.g., terminal 664, 764) is coupled with the gate electrode (e.g., gate electrode 642, 742), and terminal 1066 (e.g., terminal 666, 766) is coupled with the drain region (e.g., drain region 636, 736).

PN junction diode 1046 (e.g., the PN junction diode formed between P+ region 646 and sinker region 622, or polysilicon diode 746) and resistive network 1010 are electrically coupled in parallel between the drain region (e.g., drain region 636, 736) and the device's isolation structure. For example, resistive network 1010 may be formed from polycrystalline silicon, and may be located on an insulated region of the top surface of the substrate (e.g., on STI 654, 754). Alternatively, resistive network 1010 may be formed from other materials and/or located elsewhere. During operation, when the drain potential transitions to a negative voltage, the isolation structure potential is held up by the voltage drop across resistive network 1010 in parallel with the reverse breakdown voltage of the PN junction diode 1046 (e.g., between about −0.3 volts to about −14.0 volts or more). As with the diode circuit discussed in conjunction with FIG. 5, the combination of the PN junction diode 1046 and resistive network 1010 may have certain advantageous effects.

In the embodiments discussed in conjunction with FIGS. 9 and 10, a diode circuit (e.g., diode circuit 160, FIG. 1) includes a PN junction diode (e.g., PN junction diodes 946, 1046) and either a resistive network coupled in series (resistive network 910) or a resistive network coupled in parallel (resistive network 1010) with the PN junction diode. In another alternate embodiment, a diode circuit may include a PN junction diode and both a first resistive network coupled in series and a second resistive network coupled in parallel with the PN junction diode, in order to realize the advantages that may be provided by both the series-coupled and parallel-coupled resistive network arrangements.

Figure 11:
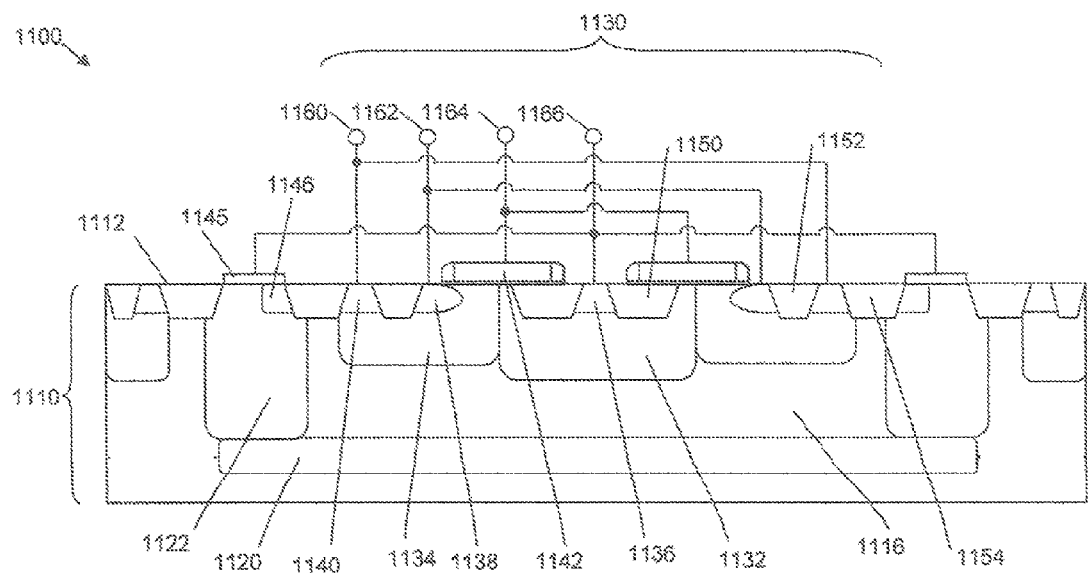
FIG. 11 is a cross-sectional view of an NLDMOSFET with a diode circuit that includes a combination of one or more Schottky diodes and one or more PN junction diodes, according to an embodiment.
Figure 13:
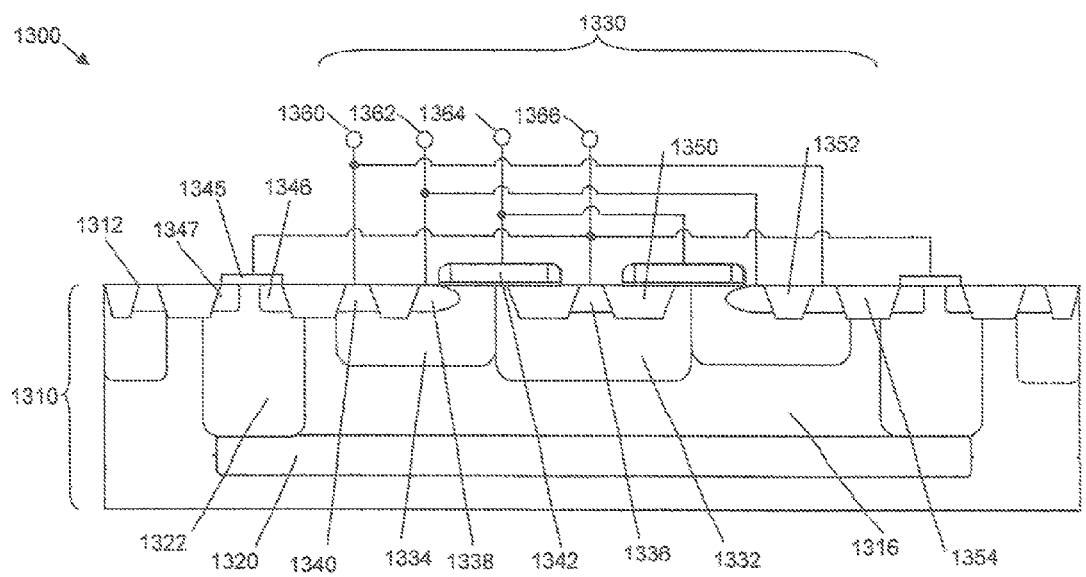
FIG. 13 is a cross-sectional view of an NLDMOSFET with a diode circuit that includes a combination of one or more Schottky diodes and one or more PN junction diodes, according to an alternate embodiment.

In the embodiments discussed in conjunction with FIGS. 2-10, a diode circuit (e.g., diode circuit 160, FIG. 1) coupling the drain region and isolation structure of an embodiment of an NLDMOSFET (e.g., NLDMOSFET 112, FIG. 1) includes either a Schottky diode or a PN junction diode. According to other embodiments, a diode circuit coupling the drain region and isolation structure of an embodiment of an NLDMOSFET instead includes a combination of one or more Schottky diodes and one or more PN junction diodes. For example, FIGS. 11 and 13 are cross-sectional views of NLDMOSFETs 1100, 1300 (e.g., NLDMOSFET 112, FIG. 1), each with a diode circuit (e.g., diode circuit 160, FIG. 1) that includes a combination of one or more Schottky diodes and one or more PN junction diodes. Again, much of the structure of the NLDMOSFETs 1100, 1300 (FIGS. 11, 13) is similar to the structure of NLDMOSFET 200 discussed in detail in conjunction with FIG. 2. For brevity, the similar structural elements are not discussed in detail below, but the discussion in conjunction with FIG. 2 is intended to apply equally to FIGS. 11 and 13. In addition, common elements of FIGS. 11 and 13 are discussed together, below, and the differences between the devices are specified thereafter.

NLDMOSFETs 1100, 1300 are formed in and on a P-type semiconductor substrate 1110, 1310 (e.g., the SOC substrate discussed in conjunction with FIG. 1), which has a top substrate surface 1112, 1312. Each NLDMOSFET 1100, 1300 includes an isolation structure that substantially surrounds a portion 1116, 1316 of the substrate 1110, 1310 associated with an active area 1130, 1330 of the NLDMOSFET 1100, 1300. The isolation structure is formed from NBL 1120, 1320 (located at a depth below the top substrate surface 1112, 1312) and an N-type sinker region 1122, 1322 extending from the top substrate surface 1112, 1312 to the depth of the NBL 1120, 1320. NLDMOSFET 1100, 1300 further includes an active device formed within the active area 1130, 1330. According to an embodiment, the active device includes an N-type drift region 1132, 1332, a P-type body region 1134, 1334, an N-type drain region 1136, 1336, an N-type source region 1138, 1338, a P-type body contact region 1140, 1340, and a gate electrode 1142, 1342. A conductive interconnect electrically couples the body contact region 1140, 1340 to a body contact terminal 1160, 1360, and an additional conductive interconnect electrically couples the source region 1138, 1338 to a source terminal 1162, 1362. Similarly, a conductive interconnect also electrically couples the gate electrode 1142, 1342 to a gate terminal 1164, 1364. NLDMOSFET 1100, 1300 may further include STI structures 1150, 1350, 1152, 1352, 1154, 1354. In alternate embodiments, some or all of STI structures 1150, 1350, 1152, 1352, 1154, and/or 1354 may be excluded. In still other alternate embodiments, some or all of the STI structures may be replaced with a silicide blocking layer.

According to an embodiment, NLDMOSFET 1100 (FIG. 11) further includes a diode circuit (e.g., diode circuit 160, FIG. 1) that includes a combination of a Schottky diode and a PN junction diode connected in parallel between drain region 1136 and the isolation structure. More particularly, the diode circuit includes a Schottky diode formed from the metal-semiconductor junction between a Schottky contact 1145 (e.g., formed with silicide on the top substrate surface 1112) and the top surface of sinker region 1122. In addition, NLDMOSFET 1100 further includes a P-type region 1146 extending into sinker region 1122 and partially across the sinker region 1122, where P-type region 1146 may be more heavily doped than P-type body region 1134. The PN junction between P-type region 1146 and sinker region 1122 forms the PN junction diode of the diode circuit. At the substrate surface 1112, the Schottky contact 1145 contacts both the top surface of the P-type region 1146 and a portion of the top surface of the sinker region 1122. According to an embodiment, placing the PN diode alongside the Schottky diode allows the PN junction to deplete the silicon under the Schottky diode, thus reducing reverse-biased leakage in the Schottky diode.

According to an embodiment, a conductive interconnect electrically couples the drain region 1136, the Schottky contact 1145, the P-type region 1146, and a drain terminal 1166. The Schottky diode and the PN junction diode can be designed to provide a desired application-dependent breakdown voltage (i.e., a breakdown voltage greater than, less than, or equal to the normal, most negative operating voltage). For example, in an embodiment, the Schottky diode and the PN junction diode each may be designed to provide a reverse breakdown voltage in a range of about −0.3 volts to about −14.0 volts, although smaller or larger breakdown voltages may be achieved, as well.

Figure 12:
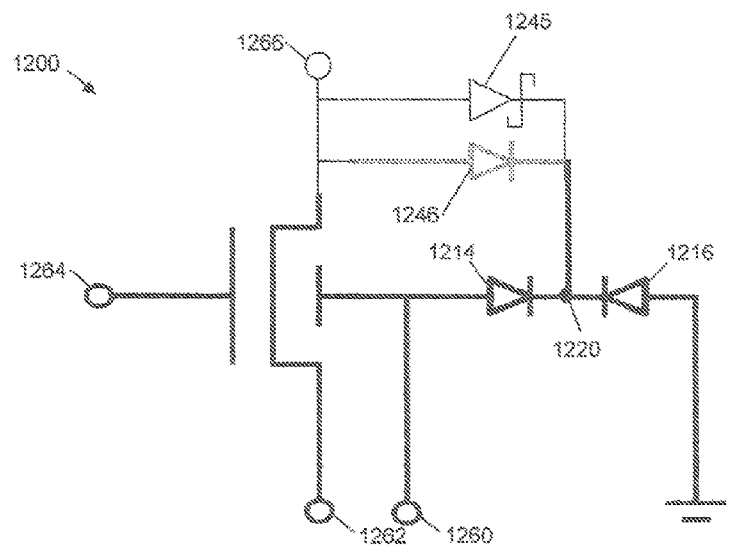
FIG. 12 is a simplified circuit representation of the NLDMOSFET of FIG. 11, according to an embodiment.

FIG. 12 is a simplified circuit representation 1200 of the NLDMOSFET 1100 of FIG. 11, according to an embodiment. Referring also to FIG. 11, terminal 1260 (e.g., terminal 1160) is coupled with the P-type body region (e.g., coupled to body region 1134 via body contact region 1140), terminal 1262 (e.g., terminal 1162) is coupled with the N-type source region (e.g., source region 1138), terminal 1264 (e.g., terminal 1164) is coupled with the gate electrode (e.g., gate electrode 1142), and terminal 1266 (e.g., terminal 1166) is coupled with the drain region (e.g., drain region 1136).

According to an embodiment, and as discussed above, the NLDMOSFET also includes Schottky diode 1245 (e.g., the interface between Schottky contact 1145 and sinker region 1122) in parallel with PN junction diode 1246 (e.g., the PN junction diode formed between P+ region 1146 and sinker region 1122), which are electrically coupled between the drain region (e.g., drain region 1136) and the device's isolation structure. According to an embodiment, and as illustrated in FIG. 11, the PN junction diode 1246 consists of the interface between P+ region 1146 and sinker region 1122. The anodes of the Schottky diode 1245 and the PN junction diode 1246 are coupled to the drain region, and the cathodes of the Schottky diode 1245 and the PN junction diode 1246 are formed by the isolation structure (e.g., the combination of sinker region 1122 and NBL 1120). In other alternate embodiments, the diode circuit may include one or more resistive networks coupled in series and/or in parallel with the combination of the Schottky diode 1245 and the PN junction diode 1246, as previously discussed in conjunction with FIGS. 4, 5, 9, and 10.

At node 1220, diode 1214 represents the diode formed by the interface between the isolation structure and the portion of the substrate within the active area of the device (e.g., the portion 1116 of the substrate 1110 within the isolation structure), and diode 1216 represents the diode formed by the interface between the isolation structure and the remainder of the substrate outside of the isolation structure.

According to another embodiment, NLDMOSFET 1300 (FIG. 13) includes a diode circuit (e.g., diode circuit 160, FIG. 1) that includes a combination of a Schottky diode and a "split" PN junction diode connected in parallel between drain region 1336 and the isolation structure. More particularly, the diode circuit includes a Schottky diode formed from the metal-semiconductor junction between a Schottky contact 1345 (e.g., formed with silicide on the top substrate surface 1312) and the top surface of sinker region 1322. In addition, NLDMOSFET 1300 further includes a first P-type region 1346 extending into sinker region 1322 and partially across the sinker region 1322 at an interior wall of the sinker region 1322 (i.e., the wall closest to the active region 1330), and a second P-type region 1347 extending into sinker region 1322 and partially across the sinker region 1322 at an exterior wall of the sinker region 1322 (i.e., the wall farthest from the active region 1330). A portion of the sinker region 1322 is present at the top substrate surface 1312 between the first and second P-type regions 1346, 1347, and Schottky contact 1345 contacts at least that portion of the sinker region 1322.

P-type regions 1346, 1347 may be more heavily doped than P-type body region 1334. The PN junctions between P-type regions 1346, 1347 and sinker region 1322 form the PN junction diodes of the diode circuit. At the substrate surface 1312, the Schottky contact 1345 contacts both the top surface of the first and second P-type regions 1346, 1347 and a portion of the top surface of the sinker region 1322. By placing multiple P-type regions 1346, 1347 close together and interleaved with the Schottky barrier, the P-type regions 1346, 1347 may help to deplete the Schottky barrier area under reverse bias to limit the leakage current.

According to an embodiment, a conductive interconnect electrically couples the drain region 1336, the Schottky contact 1345, the P-type regions 1346, 1347, and a drain terminal 1366. The Schottky diode and the PN junction diodes can be designed to provide a desired application-dependent breakdown voltage (i.e., a breakdown voltage greater than, less than, or equal to the normal, most negative operating voltage). For example, in an embodiment, the Schottky diode and the PN junction diodes each may be designed to provide a reverse breakdown voltage in a range of about −0.3 volts to about −14.0 volts, although smaller or larger breakdown voltages may be achieved, as well.

Figure 14:
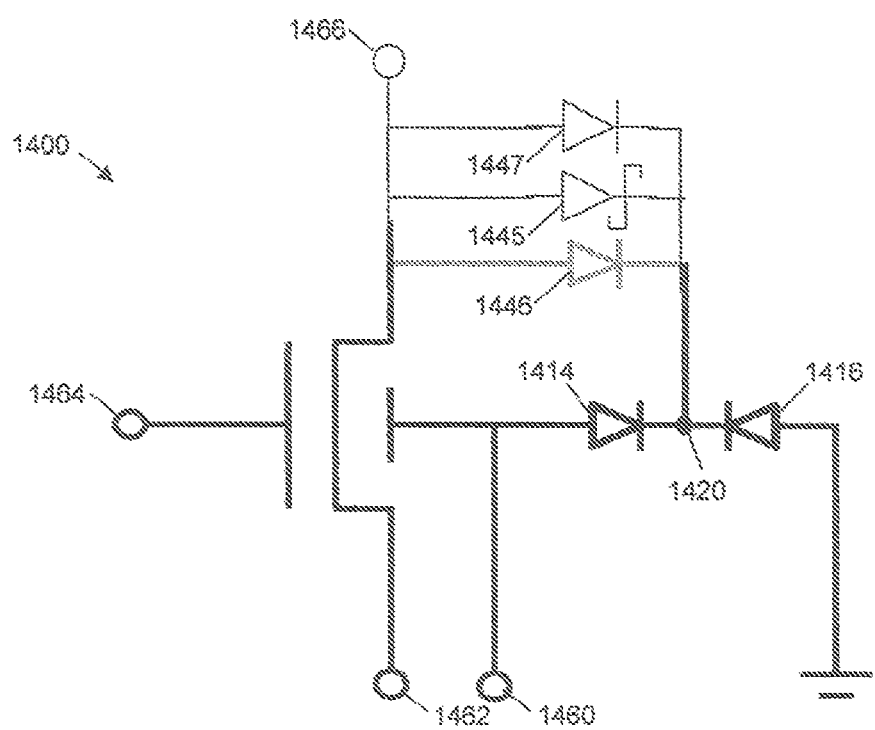
FIG. 14 is a simplified circuit representation of the NLDMOSFET of FIG. 13, according to an embodiment.

FIG. 14 is a simplified circuit representation 1400 of the NLDMOSFET 1300 of FIG. 13, according to an embodiment. Referring also to FIG. 13, terminal 1460 (e.g., terminal 1360) is coupled with the P-type body region (e.g., coupled to body region 1334 via body contact region 1340), terminal 1462 (e.g., terminal 1362) is coupled with the N-type source region (e.g., source region 1338), terminal 1464 (e.g., terminal 1364) is coupled with the gate electrode (e.g., gate electrode 1342), and terminal 1466 (e.g., terminal 1366) is coupled with the drain region (e.g., drain region 1336).

According to an embodiment, and as discussed above, the NLDMOSFET also includes Schottky diode 1445 (e.g., the interface between Schottky contact 1345 and sinker region 1322) in parallel with first and second PN junction diodes 1446, 1447 (e.g., the PN junction diodes formed between P+ regions 1346, 1347 and sinker region 1322), which are electrically coupled between the drain region (e.g., drain region 1336) and the device's isolation structure. According to an embodiment, and as illustrated in FIG. 13, the PN junction diodes 1446, 1447 consist of the interface between P+ regions 1346, 1347 and sinker region 1322. The anodes of the Schottky diode 1445 and the PN junction diodes 1446, 1447 are coupled to the drain region, and the cathodes of the Schottky diode 1445 and the PN junction diodes 1446, 1447 are formed by the isolation structure (e.g., the combination of sinker region 1322 and NBL 1320). In other alternate embodiments, the diode circuit may include one or more resistive networks coupled in series and/or in parallel with the combination of the Schottky diode 1445 and the PN junction diodes 1446, 1447, as previously discussed in conjunction with FIGS. 4, 5, 9, and 10.

At node 1420, diode 1414 represents the diode formed by the interface between the isolation structure and the portion of the substrate within the active area of the device (e.g., the portion 1316 of the substrate 1310 within the isolation structure), and diode 1416 represents the diode formed by the interface between the isolation structure and the remainder of the substrate outside of the isolation structure.

Referring to both FIGS. 12 and 14, during normal operation in which the drain potential is elevated, the Schottky diode 1245, 1445 and PN junction diode(s) 1246, 1446, 1447 are forward biased, and the Schottky diode 1245, 1445 clamps the forward bias of the PN junction diode(s) 1246, 1446, 1447. Accordingly, the isolation structure potential closely follows that of the drain region with a relatively small forward voltage drop associated with the Schottky diode 1245, 1445 and the PN junction diode(s) 1246, 1446, 1447. On the other hand, when the drain potential transitions to a negative voltage, the isolation structure potential is held up by the reverse breakdown voltage of the Schottky diode 1245, 1445 and/or the PN junction diode(s) 1246, 1446, 1447 (e.g., between about −0.3 volts to about −14.0 volts or more). As with the embodiment previously discussed in conjunction with FIG. 2, by holding up the potential of the isolation structure when the drain potential goes negative, carrier injection into the substrate that may otherwise occur if the drain and isolation structure were merely shorted may be reduced or eliminated, thus avoiding disruption of adjacent circuit blocks.

Figure 15:
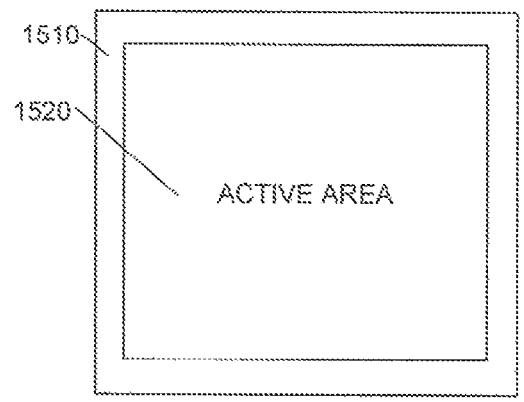
FIG. 15 is a simplified top-view of a ring-shaped configuration of a sinker region, a Schottky contact, or a P-type region of a PN junction diode that extends all the way across the sinker region at the substrate top surface, according to various embodiments.

As discussed previously, various regions of the embodiments of NLDMOSFETs discussed above may have a ring-shaped configuration. For example, the sinker regions (e.g., sinker regions 222, 622, 722, 1122, 1322, FIGS. 2, 6, 7, 11, 13) may have a ring-shaped configuration that substantially surrounds the active area of the device, and the corresponding Schottky contacts (e.g., Schottky contacts 246, 1145, 1345, FIGS. 2, 11, 13) and/or P-type regions (e.g., P-type regions 646, 1146, 1346, 1347, FIGS. 6, 11, 13) associated with the Schottky and PN junction diodes also may have ring-shaped configurations. For example, FIG. 15 is a simplified top-view of a ring-shaped configuration 1510 of a sinker region (e.g., sinker region 222, 622, 722, 1122, 1322, FIGS. 2, 6, 7, 11, 13), a Schottky contact (e.g., Schottky contact 246, 1145, 1345, FIGS. 2, 11, 13), or a P-type region of a PN junction diode that extends all the way across the sinker region (e.g., P-type region 646, FIG. 6), according to various embodiments. As shown, the sinker region, Schottky contact, or P-type region substantially surrounds the active area 1520 of the device. In alternate embodiments, the sinker region, Schottky contact, or P-type region may not fully surround the active area 1520 of the device. For example, although the sinker region may substantially surround the active area 1520 of the device, the Schottky contact may contact only a portion (or portions) of the top surface of the sinker region. Similarly, the P-type region may be present around only a portion (or portions) of the top surface of the sinker region.

Figure 16:
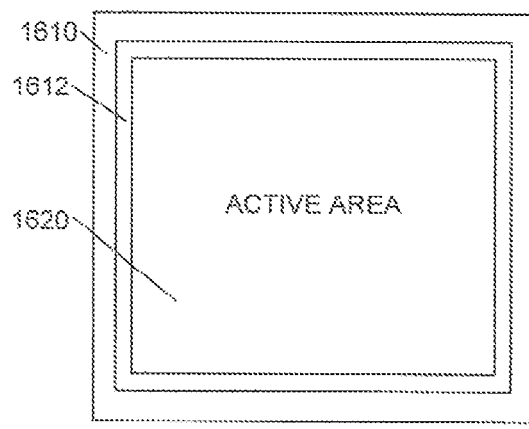
FIG. 16 is a simplified top-view of a ring-shaped configuration of a sinker region and a P-type region of a PN junction diode that does not extend all the way across the sinker region at the substrate top surface, according to an embodiment.

As discussed above, in some embodiments, the P-type region of a PN junction diode may not extend all the way across the sinker region (e.g., P-type region 1146, FIG. 11). In such embodiments, the sinker region, P-type region, and Schottky contact (if one is present) may be concentrically arranged. For example, FIG. 16 is a simplified top-view of a ring-shaped configuration of a sinker region 1610 (e.g., sinker region 1122, FIG. 11) and a P-type region 1612 of a PN junction diode that does not extend all the way across the sinker region (e.g., P-type region 1146, FIG. 11), according to an embodiment. A Schottky contact (e.g., Schottky contact 1145, FIG. 11) may completely or partially overlie the concentrically arranged sinker region 1610 and P-type region 1612. As shown, the sinker region and P-type region substantially surround the active area 1620 of the device. In alternate embodiments, the sinker region and/or P-type region may not fully surround the active area 1620 of the device. For example, although the sinker region may substantially surround the active area 1620 of the device, the P-type region may be present around only a portion (or portions) of the sinker region.

Figure 17:
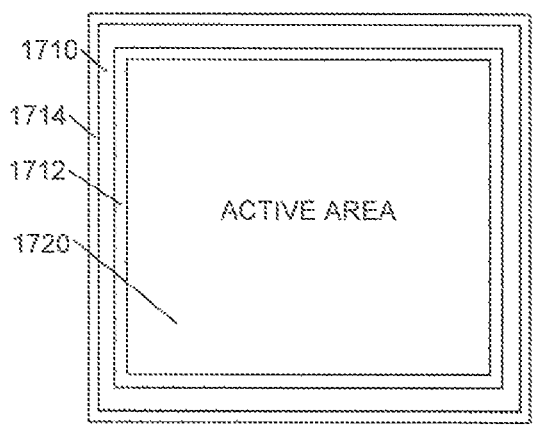
FIG. 17 is a simplified top-view of a ring-shaped configuration of a sinker region, a first P-type region of a first PN junction diode, and a second P-type region of a second PN junction diode, according to an embodiment.

As also discussed above, in other embodiments two P-type regions associated with two PN junction diodes may be included at opposed walls of the sinker region, where the P-type regions do not extend all the way across the sinker region (e.g., P-type regions 1346, 1347, FIG. 13). In such other embodiments, the sinker region, P-type regions, and Schottky contact (if one is present) also may be concentrically arranged. For example, FIG. 17 is a simplified top-view of a ring-shaped configuration of a sinker region 1710 (e.g., sinker region 1322, FIG. 13), a first P-type region 1712 of a first PN junction diode (e.g., P-type region 1346, FIG. 13), and a second P-type region 1714 of a second PN junction diode (e.g., P-type region 1347, FIG. 13), according to an embodiment. A Schottky contact (e.g., Schottky contact 1345, FIG. 13) may completely or partially overlie the concentrically arranged sinker region 1710 and P-type regions 1712, 1714. As shown, the sinker region and P-type regions substantially surround the active area 1720 of the device. In alternate embodiments, the sinker region and/or P-type regions may not fully surround the active area 1720 of the device. For example, although the sinker region may substantially surround the active area 1720 of the device, either or both P-type regions may be present around only a portion (or portions) of the sinker region.

Figure 18:
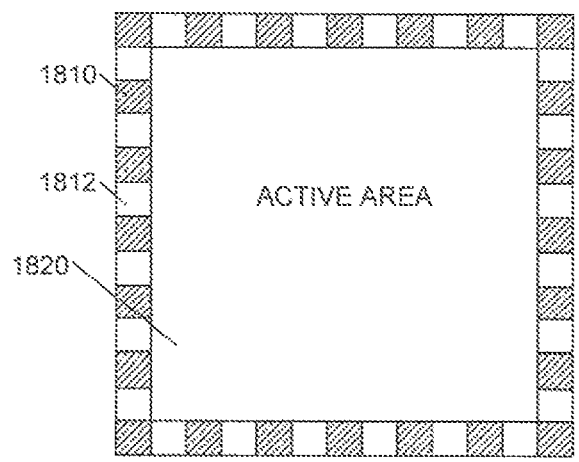
FIG. 18 is a simplified top-view of a configuration of Schottky contacts and P-type regions arranged in an alternating arrangement around a ring-shaped sinker region that surrounds the active area of a device, according to another alternate embodiment.

In still other embodiments that include a combination of Schottky contacts and PN junction diodes in contact with the isolation structures (or more specifically the sinker regions), the Schottky contacts and P-type regions associated with the PN junction diodes may be placed in an alternating arrangement around a ring-shaped sinker region. For example, FIG. 18 is a simplified top-view of a configuration of Schottky contacts 1810 and P-type regions 1812 arranged in an alternating arrangement around a ring-shaped sinker region that surrounds the active area 1820 of a device, according to another alternate embodiment. In all embodiments illustrated in the figures and discussed herein that include both a Schottky diode and one or more PN junction diodes constructed using the sinker region, the P-type anode regions of the PN diodes do not need to intersect the semiconductor surface, nor do they need to physically form one or more larger connected regions. In various embodiments, it is sufficient that the P-type anode regions of the PN junction diodes are capable of being electrically accessed (e.g., through sidewall contacts or buried diffusions) and connected to form series and/or parallel combinations with the Schottky diodes.

Figure 19:
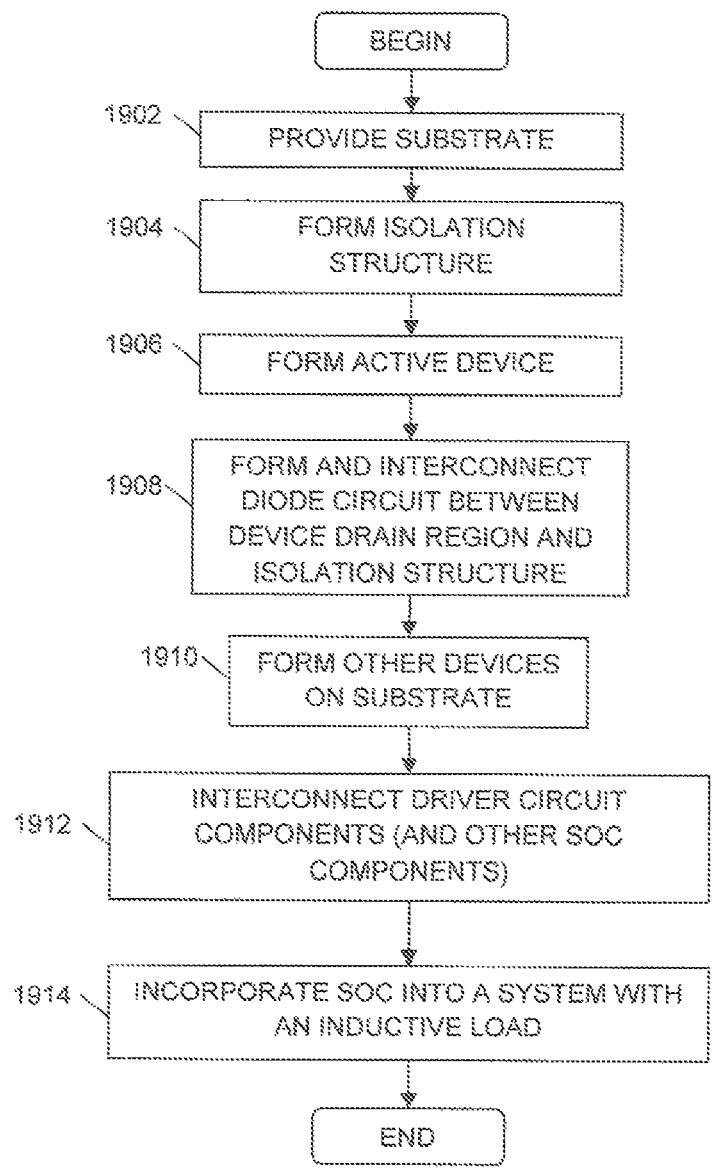
FIG. 19 is a simplified flow diagram illustrating a method for forming the devices illustrated in FIGS. 2, 6 7, 11, and 13, and incorporating those devices into a system with an inductive load, according to various embodiments.

FIG. 19 is a simplified flow diagram illustrating a method for forming the devices illustrated, for example in FIGS. 2, 6 7, 11, and 13, and incorporating those devices into an SOC and a system (e.g., system 100, FIG. 1) with an inductive load (e.g., inductive load 132, FIG. 1), according to various embodiments. Standard semiconductor processing techniques may be employed in producing the SOC, and for the purpose of brevity, those techniques are not described in detail herein.

The method begins, in block 1902, by providing a substrate (e.g., an SOC substrate) having a first conductivity type (e.g., P-type substrate 210, 610, 710, 1110, 1310). The substrate may include a base substrate and an epitaxial layer grown on the base substrate, for example. An active device (e.g., associated with a driver circuit) may then be formed (blocks 1904, 1906, 1908). For example, in block 1904, an isolation structure may be formed in the substrate. As described in detail previously, the isolation structure may include a buried layer of a second conductivity type (e.g., NBL 220, 620, 720, 1120, 1320) and a sinker region of the second conductivity type (e.g., sinker region 222, 622, 722, 1122, 1322) extending from the substrate top surface to the buried layer. The isolation structure formed from the combination of the buried layer and sinker region may substantially surround an active area of the device (e.g., active area 230, 630, 730, 1130, 1330). In block 1906, an active device may be formed within the active area. For example, an active device formed in the active area may include a drift region of the second conductivity type, a body region of the first conductivity type, a drain region of the second conductivity type, a source region of the second conductivity type, a body contact region of the first conductivity type, and a gate electrode (and corresponding gate dielectric), as previously described.

In block 1908, a diode circuit (e.g., diode circuit 160, FIG. 1) may be formed and interconnected between the device's drain region (e.g., drain region 236, 636, 736, 1136, 1336) and the isolation structure (or more specifically the sinker region, such as sinker region 222, 622, 722, 1122, 1322). For example, as described in detail above in conjunction with FIGS. 2-18, embodiments of diode circuits may include one or more Schottky diodes, PN junction diodes, and resistive networks.

In block 1910, which may be performed in parallel with blocks 1904, 1906, and 1908, "other devices" may be formed in and on the substrate, including forming additional devices associated with a driver circuit (e.g., driver circuit 110, FIG. 1) and additional devices associated with a system on a chip (SOC) (e.g., processing components, memory arrays, and other circuitry). The driver circuit and other SOC components may be interconnected, in block 1912, and the SOC substrate may be packaged, thus completing fabrication of the SOC. In block 1914, the SOC, whether packaged or not, may be incorporated into a larger system, such as a system that includes an inductive load (e.g., inductive load 132, FIG. 1), and the method may end.

As discussed previously, the device formed in blocks 1904, 1906 and 1908 is configured to reduce or eliminate current injection into the SOC substrate under various operating conditions. More particularly, the diode circuit coupled between the drain region and the isolation structure of at least one active device of the driver circuit may result in reduction or elimination of injection current, when compared with other systems in which such a diode circuit is not present (e.g., in systems in which the drain region and isolation structure are merely shorted together). Accordingly, the various embodiments may produce significant advantageous results.

While at least one exemplary embodiment has been presented in the foregoing detailed description, it should be appreciated that a vast number of variations exist, especially with respect to choices of device types, materials and doping. It should be appreciated that the exemplary embodiment or exemplary embodiments are only examples, and are not intended to limit the scope, applicability, or configuration of the embodiments in any way. Rather, the foregoing detailed description will provide those skilled in the art with a convenient road map for implementing the exemplary embodiment or exemplary embodiments. It should be understood that various changes can be made in the function and arrangement of elements without departing from the scope of the inventive subject matter as set forth in the appended claims and the legal equivalents thereof.

What is claimed is:

1. A method for forming a semiconductor device, the method comprising the steps of:
   forming a buried layer below a top substrate surface of a semiconductor substrate having a first conductivity type, wherein the buried layer has a second conductivity type that is different from the first conductivity type;
   forming a sinker region between the top substrate surface and the buried layer, wherein the sinker region has the second conductivity type, and an isolation structure is formed by the sinker region and the buried layer;
   forming an active device in a portion of the semiconductor substrate contained by the isolation structure, wherein the active device includes
      a drift region of the second conductivity type within a central portion of the active area and extending from the top substrate surface into the semiconductor substrate to a first depth, and
      a drain region of the second conductivity type, wherein the drain region extends into the drift region from the top substrate surface to a second depth that is less than the depth of the drift region; and
   forming a diode circuit connected between the isolation structure and the drain region.

2. The method of claim 1, wherein forming the diode circuit comprises:
   forming a Schottky contact coupled with the isolation region.

3. The method of claim 2, wherein forming the diode circuit further comprises:
   forming a resistive network in series with the Schottky contact.

4. The method of claim 2, wherein forming the diode circuit further comprises:
   forming a resistive network in parallel with the Schottky contact.

5. The method of claim 2, wherein forming the diode circuit further comprises:
   forming a resistive network in series with the Schottky contact; and
   forming a resistive network in parallel with the Schottky contact.

6. The method of claim 2, further comprising:
   forming a further region of the first conductivity type extending into the sinker region and partially across the sinker region, wherein the diode circuit comprises the Schottky contact and a PN junction diode formed between the further region and the sinker region.

7. The method of claim 2, further comprising:
   forming a first further region of the first conductivity type extending into the sinker region and partially across the sinker region at an interior wall of the sinker region; and
   forming a second further region of the first conductivity type extending into the sinker region and partially across the sinker region at an exterior wall off the sinker region, wherein a portion of the sinker region is present at the top substrate surface between the first further region and the second further region, and wherein the diode circuit comprises the Schottky contact, a first PN junction diode formed between the first further region and the sinker region, and a second PN junction diode formed between the second further region and the sinker region.

8. The method of claim 2, wherein forming the sinker region includes forming the sinker region as a ring that substantially surrounds the active area, the Schottky contact is positioned at a first portion of the ring, and the method further comprises:
   forming one or more additional Schottky contacts positioned portions of the ring that are spatially separated from the first portion and from each other; and
   forming a plurality of further regions of the first conductivity type extending from the top substrate surface into the sinker region at a top surface of the sinker region, wherein the plurality of further regions are positioned at other portions of the ring that are interspersed between the Schottky contacts.

9. The method of claim 1, wherein forming the diode circuit comprises:
   forming a further region of the first conductivity type extending into the sinker region, wherein the diode circuit comprises a PN junction diode formed between the further region and the sinker region.

10. The method of claim 1, wherein forming the diode circuit comprises:
    forming and interconnecting a polycrystalline silicon diode between the drain region and the sinker region.

* * * * *